United States Patent
Miyaji et al.

(10) Patent No.: US 10,649,014 B2
(45) Date of Patent: May 12, 2020

(54) FREQUENCY CHARACTERISTIC MEASURING METHOD AT FEED AXIS CONTROL UNIT

(71) Applicant: Okuma Corporation, Niwa-Gun (JP)

(72) Inventors: Masashi Miyaji, Niwa-Gun (JP); Takashi Norihisa, Niwa-Gun (JP)

(73) Assignee: Okuma Corporation, Niwa-Gun (JP)

( * ) Notice: Subject to any disclaimer, the term of this patent is extended or adjusted under 35 U.S.C. 154(b) by 452 days.

(21) Appl. No.: 15/440,201

(22) Filed: Feb. 23, 2017

(65) Prior Publication Data
US 2017/0292980 A1 Oct. 12, 2017

(30) Foreign Application Priority Data
Apr. 8, 2016 (JP) .................. 2016-078292

(51) Int. Cl.
  *G01R 23/16* (2006.01)
  *G01R 31/34* (2020.01)
  *G01R 23/02* (2006.01)
(52) U.S. Cl.
  CPC ............. *G01R 23/16* (2013.01); *G01R 23/02* (2013.01); *G01R 31/34* (2013.01)
(58) Field of Classification Search
  CPC ......... G01R 23/16; G01R 31/34; G01R 23/02
  See application file for complete search history.

(56) References Cited

U.S. PATENT DOCUMENTS

| | | | | |
|---|---|---|---|---|
| 5,251,155 A | * | 10/1993 | Adachi .................. | G01R 23/16 244/164 |
| 6,211,640 B1 | | 4/2001 | Fujisaki et al. | |
| 6,625,502 B2 | | 9/2003 | Ito et al. | |
| 2003/0201748 A1 | * | 10/2003 | Hayashi ................ | G05B 19/19 318/638 |
| 2008/0180052 A1 | * | 7/2008 | Iwashita ................ | G05B 19/19 318/615 |

(Continued)

FOREIGN PATENT DOCUMENTS

| | | |
|---|---|---|
| JP | 2000-278990 A | 10/2000 |
| JP | 2001-175303 A | 6/2001 |

(Continued)

OTHER PUBLICATIONS

Japanese Office Action (and an English translation obtained from the Global Dossier) from a corresponding Japanese patent application (JP 2016-078292) dated Dec. 3, 2019, 6 pages.

*Primary Examiner* — Akm Zakaria

(74) *Attorney, Agent, or Firm* — Burr & Brown, PLLC

(57) ABSTRACT

A method measures a frequency characteristic at a feed axis control unit configured to drive a motor in accordance with a velocity command value to control a velocity or a position of a movable portion of a driven body. The velocity command value includes a velocity reference value from a host device or a velocity command calculator and a sweep signal swept in order to measure the frequency characteristic. The method includes moving the feed axis in one direction by commanding the velocity reference value where a moving velocity of the feed axis is constant, exciting by providing a sine wave having an amplitude less than a magnitude of the velocity reference value to the sweep signal, and measuring the frequency characteristic of a feed axis drive system including the motor.

3 Claims, 5 Drawing Sheets

(56) References Cited

U.S. PATENT DOCUMENTS

| | | | |
|---|---|---|---|
| 2013/0249445 A1* | 9/2013 | Sumioka | H02N 2/142 318/116 |
| 2015/0241869 A1 | 8/2015 | Tezuka et al. | |
| 2016/0033959 A1 | 2/2016 | Iijima et al. | |

FOREIGN PATENT DOCUMENTS

| | | |
|---|---|---|
| JP | 2002-258922 A | 9/2002 |
| JP | 2006-221404 A | 8/2006 |
| JP | 2015-158734 A | 9/2015 |
| JP | 2016-034224 A | 3/2016 |

* cited by examiner

FREQUENCY CHARACTERISTIC MEASURING METHOD AT FEED AXIS CONTROL UNIT

BACKGROUND

This application claims the benefit of Japanese Patent Application Number 2016-078292 filed on Apr. 8, 2016, the entirety of which is incorporated by reference.

TECHNICAL FIELD

The disclosure relates to a method for measuring a frequency characteristic of a feed axis drive system including a motor, at a feed axis control unit used for a machine tool or similar tool.

RELATED ART

At a position control unit or a velocity control unit that controls a feed axis at a machine tool or similar tool, it is general to measure a frequency characteristic of a feed axis drive system including a motor and evaluate machine resonance characteristic, response characteristic, and stability so as to design and optimize a control controller.

As such a measuring method, for example, Japanese Unexamined Patent Application Publication No. 2000-278990 (JP-A-2000-278990) discloses a method that provides white noise as a position command or a velocity command to measure an open-loop characteristic.

Japanese Unexamined Patent Application Publication No. 2001-175303 (JP-A-2001-175303) discloses a method that separates a velocity feedback from a feedback loop of a velocity control system and provides white noise as a velocity command to measure a velocity open-loop characteristic, and then changes a velocity loop gain.

Furthermore, Japanese Unexamined Patent Application Publication No. 2006-221404 (JP-A-2006-221404) discloses a method that superimposes a sine wave signal and an M-sequence signal on control input to measure an open-loop frequency characteristic and a closed-loop frequency characteristic.

On the other hand, it is known that a lost motion caused by elastic deformation or similar factor interposes into the feed axis drive system. Japanese Unexamined Patent Application Publication No. 2002-258922 (JP-A-2002-258922) discloses a method that focuses on the fact that the lost motion characteristic has a "nonlinear spring characteristic" where rigidity is low when friction force is small and the rigidity is high when the friction force is large to compensate this.

However, the disclosures in JP-A-2000-278990, JP-A-2001-175303, and JP-A-2006-221404 measure the frequency characteristic by sweeping the white noise and the M-sequence signal whose displacement is small, and thus having a problem that sufficient output cannot be obtained as controlled variable in consequence of the friction and the lost motion that act on the drive system to decrease a gain characteristic of the frequency characteristic compared with a true value. Consequently, an accurate measurement cannot be made.

Especially, when sweeping the sine wave signal as in the disclosure of JP-A-2006-221404, it is necessary to excite with sine wave in a range of all the frequencies to be measured. Accordingly, there are problems such that it takes a time to measure, and because of continuing to be excited with the sine wave having a minute amplitude, grease and lubricating oil are run out at a bearing and a guiding part, which causes generation of fretting.

On the other hand, the disclosure in JP-A-2002-258922 does not evaluate each of a low-rigidity spring characteristic found within a displacement range of the lost motion and a high-rigidity spring characteristic found out of the displacement range of the lost motion, in a frequency domain. Accordingly, there is a problem such that the resonance characteristic and the stability cannot be considered, thus a feedback-control controller cannot be optimized.

Therefore, the present disclosure has been made in view of the above-described problems, and it is an object of the disclosure to provide a frequency characteristic measuring method at a feed axis control unit that ensures an accurate frequency characteristic measurement without generating the fretting and without being influenced by the friction and the lost motion that act on the drive system.

SUMMARY

In order to achieve the above-described object, there is provided a method for measuring frequency characteristic at a feed axis control unit according to a first aspect of the disclosure. The feed axis control unit may be configured to drive a motor in accordance with a velocity command value to control a velocity or a position of a movable portion of a driven body. The velocity command value may include a velocity reference value from a host device or a velocity command calculator, and a sweep signal swept in order to measure the frequency characteristic. The method may include moving the feed axis in one direction by commanding the velocity reference value where a moving velocity of the feed axis is constant, exciting by providing a sine wave having an amplitude less than a magnitude of the velocity reference value to the sweep signal, and measuring the frequency characteristic of a feed axis drive system including the motor.

In the configuration of the first aspect, the method for measuring frequency characteristic at the feed axis control unit according to a second aspect of the disclosure may include calculating a frequency spectrum of an input and output signal of a transfer characteristic to be measured, and calculating the transfer characteristic at the frequency within a predetermined frequency range. The calculation of the frequency spectrum may include resampling the input and output signal with a sampling frequency with an integral multiple of the sweep frequency to clip at least one-cycle steady response data of the input and output signal, and calculating the frequency spectrum with respect to the sweep frequency included in the clipped steady response data to correct amplitude attenuation of the frequency characteristic due to the resampling.

In order to achieve the above-described object, there is provided a method for measuring frequency characteristic at a feed axis control unit according to a third aspect of the disclosure. The feed axis control unit may be configured to drive a motor in accordance with a velocity command value to control a velocity or a position of a movable portion of a driven body. The velocity command value may include a velocity reference value from a host device or a velocity command calculator, and a sweep signal swept in order to measure the frequency characteristic. The method may include moving the feed axis in one direction by commanding the velocity reference value where a moving velocity of the feed axis is constant, exciting by providing a sine wave having a predetermined amplitude to the sweep signal, and measuring the frequency characteristic of a feed axis drive system including the motor. Further, the method may include setting the amplitude of the sine wave to a value smaller than a product of a ratio of the circumference of a circle to its diameter, a frequency of the sine wave to be swept, and a lost motion amount of the feed axis drive system. The method may also include setting a magnitude of the velocity reference value to be less than the amplitude of the sine wave. The measuring may include calculating a frequency spectrum of an input and output signal of a transfer characteristic to be measured, and calculating the transfer characteristic at the frequency within a predetermined frequency range. The calculation of frequency spectrum may include resampling the input and output signal with a sampling frequency with an integral multiple of the sweep frequency to clip at least one-cycle steady response data of the input and output signal, and calculating the frequency spectrum with respect to the sweep frequency included in the clipped steady response data to correct amplitude attenuation of the frequency characteristic due to the resampling.

With the method for measuring frequency characteristic at the feed axis control unit according to the embodiment, by execution of moving the feed axis in one direction by commanding the velocity reference value where the moving velocity of the feed axis is constant, exciting by providing the sine wave having the predetermined amplitude to the sweep signal, and measuring the frequency characteristic of the feed axis drive system including the motor, the feed axis drive system is constantly continued to be moved in the one direction, even while exciting with the sine wave by the sweep signal. Accordingly, there is no worry that the grease and the lubricating oil are run out at the bearing and the guiding part, which causes generation of the fretting. Additionally, the influence of the friction and the lost motion that reduce the controlled variable by, for example, inverting the moving direction can be eliminated to ensure the accurate frequency characteristic measurement.

Especially, with the method for measuring frequency characteristic at the feed axis control unit according to a second aspect of the disclosure, in addition to the above-described effect, the measuring includes the calculation of the frequency spectrum and the calculation of the transfer characteristic at the frequency within a predetermined frequency range. At the calculation of the frequency spectrum, the input and output signal is resampled with a sampling frequency with the integral multiple of the sweep frequency to clip at least one-cycle steady response data of the input and output signal, and the frequency spectrum with respect to the sweep frequency included in the clipped steady response data is calculated to correct the amplitude attenuation of the frequency characteristic due to the resampling. In the above manner, a period required for the sine wave excitation with each frequency component is limited to a sine-wave one-cycle period in a steady state and a period in a transient state until arriving at the steady state which is very short. Accordingly, the period required for measuring the frequency characteristic is minimized, and a risk that the grease and the lubricating oil are run out at the bearing and the guiding part, which leads to the fretting, is suppressed.

Especially, with the method for measuring frequency characteristic at the feed axis control unit according to a third aspect of the disclosure, in addition to the above-described effect, the amplitude of the sine wave is set to the value smaller than the product of the ratio of the circumference of a circle to its diameter, the frequency of the sine wave to be swept, and the lost motion amount of the feed axis drive system, and the magnitude of the velocity reference value is set to be less than the amplitude of the sine wave. In the above manner, the frequency characteristic that focuses on the low-rigidity spring characteristic in the nonlinear spring characteristic that the lost motion indicates is measured.

DETAILED DESCRIPTION

The following describes embodiments of the disclosure based on the drawings.

Figure 1:
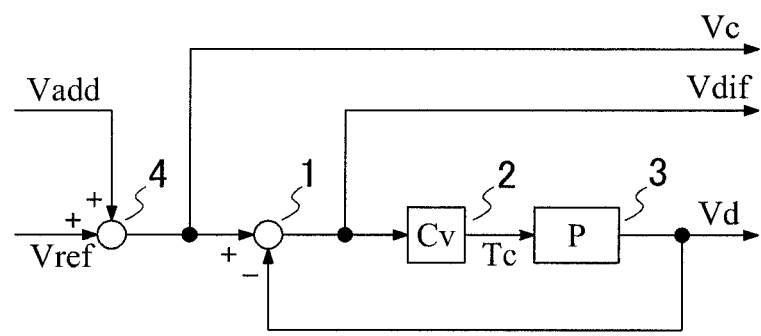
FIG. 1 is a block diagram of a feed axis control unit that performs velocity control.

FIG. 1 is a block diagram illustrating one example of a feed axis control unit that performs velocity control. In FIG. 1, a subtractor 1 calculates a velocity deviation Vdif from a difference between a velocity command value Vc and a velocity detection value Vd obtained by differentiating a position detection value Pd of a position detector installed at a motor (a servo motor at a machine tool) or a driven body (for example, a processing table at the machine tool) inside a target plant (for example, the machine tool) 3, or calculates the velocity deviation Vdif from a difference between a velocity command value Vc and a velocity detection value Vd directly obtained from a velocity detector installed at the motor or the driven body inside the target plant 3.

The calculated velocity deviation Vdif is amplified at a torque command calculator 2 to be a torque command value Tc. The target plant 3 generates torque equivalent to the torque command value Tc at the motor inside the target plant 3 to drive the driven body disposed inside the target plant 3 via, for example, a ball screw.

The velocity command value Vc is calculated such that a velocity reference value Vref commanded from a host device (an NC device at the machine tool) (not illustrated) is added to a sweep signal Vadd to be swept for measuring a frequency characteristic at an adder 4.

Figure 2:
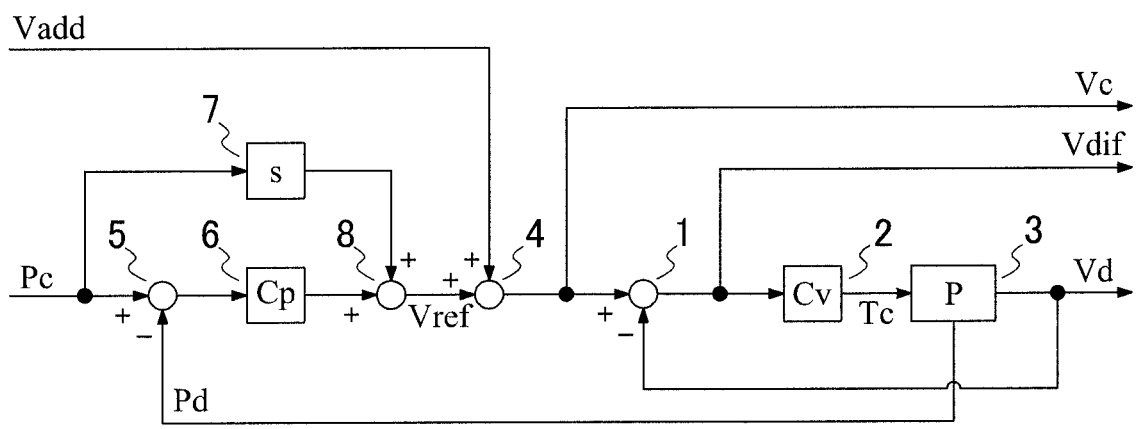
FIG. 2 is a block diagram of a feed axis control unit that performs position control.

On the other hand, a control configuration for performing the disclosure may be a feed axis control unit that performs position control as illustrated in FIG. 2.

A subtractor 5 illustrated in FIG. 2 calculates a difference between a position command value Pc commanded from a host device (not illustrated) and a position detection value Pd directly obtained from the position detector installed at the motor or the driven body inside the target plant 3, or calculates a difference between the position command value Pc commanded from a host device and the position detection value Pd obtained by integrating the velocity detection value Vd of the velocity detector installed at the motor or the driven body inside the target plant 3.

The value output from the subtractor 5 is amplified at a velocity command calculator 6 to be added to a velocity feed forward at an adder 8. The velocity feed forward is obtained by differentiating the position command value Pc at a differentiator 7. The added value is defined as a velocity reference value Vref. Other configuration is similar to that in FIG. 1.

Here, considering transfer characteristics from the velocity deviation Vdif and the velocity command value Vc to the velocity detection value Vd, the respective transfer characteristics can be expressed in the following expression (1) and expression (2).

$$Vd/Vdif=Cv \cdot P \quad (1)$$

$$Vd/Vc=Cv \cdot P/(1+Cv \cdot P) \quad (2)$$

The above-described expression (1) means that an open-loop transfer characteristic of a velocity control system: Cv·P can be calculated from a frequency spectrum of the velocity deviation Vdif and a frequency spectrum of the velocity detection value Vd.

Similarly, the above-described expression (2) means that a closed-loop transfer characteristic of the velocity control system: Cv·P/(1+Cv·P) can be calculated from a frequency spectrum of the velocity command value Vc and the frequency spectrum of the velocity detection value Vd. In order to obtain these transfer characteristics, a sine wave signal may be provided as the sweep signal Vadd.

The following describes a method that accurately measures the frequency characteristic without generating fretting and without being influenced by friction and lost motion that act on the drive system, at the above-described feed axis control unit.

Figure 3:
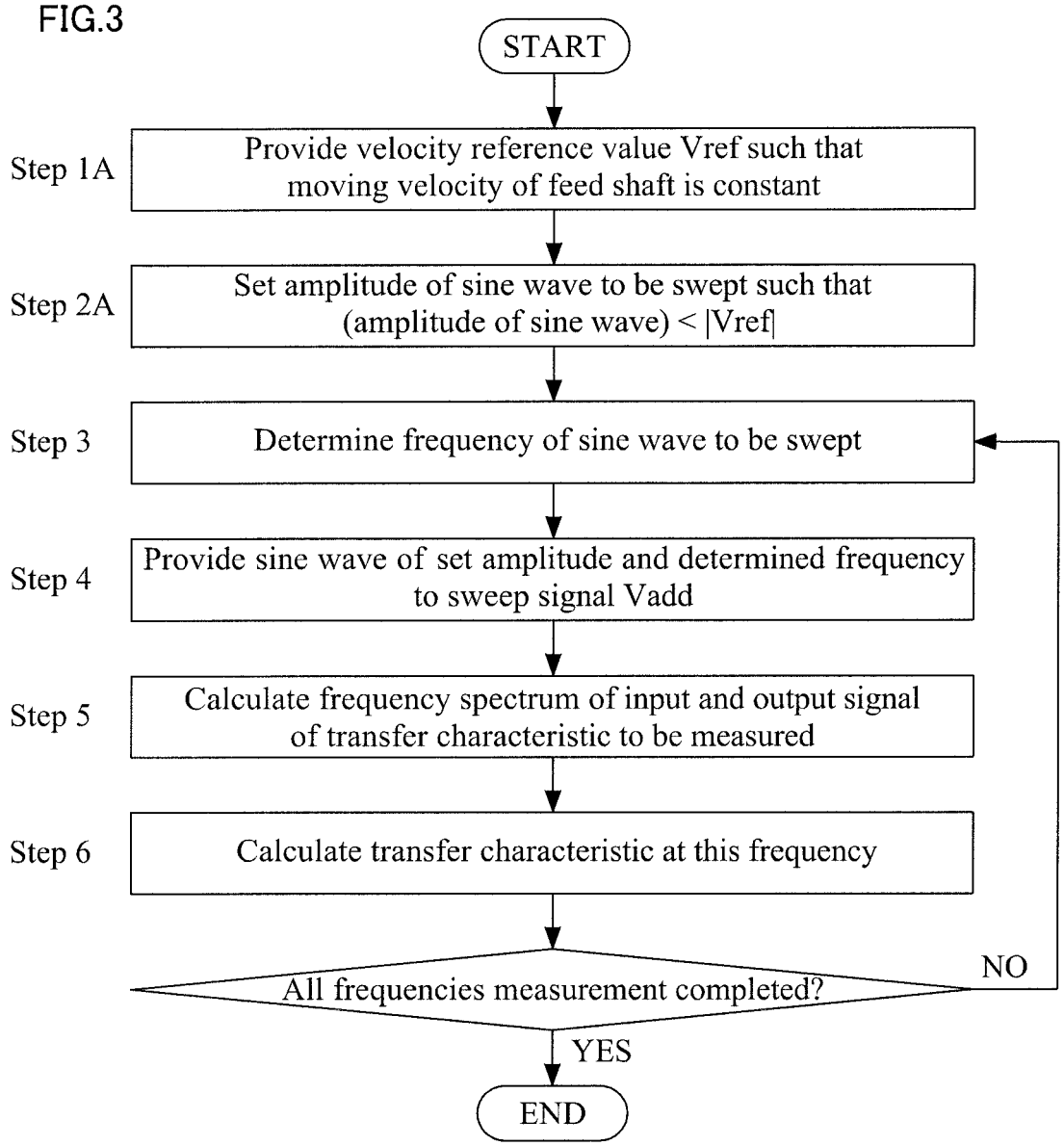
FIG. 3 is a flowchart illustrating a frequency characteristic measuring method according to an embodiment 1.

FIG. 3 is a flowchart illustrating a first embodiment in a frequency characteristic measuring method of the disclosure.

First, the velocity reference value Vref is provided such that a moving velocity of a feed axis is constant at Step 1A. The velocity reference value Vref is directly provided from the host device in a case of the configuration in FIG. 1, and is equivalent to a differential value of the position command value Pc commanded from the host device in a case of the configuration in FIG. 2. Thus, Step 1A, for example, corresponds to provision of F command by, for example, an NC program at the feed axis of the machine tool. The Step 1A will be a moving step.

Next, for the sine wave provided to the sweep signal Vadd, after setting an amplitude such that the amplitude is smaller than a magnitude of the velocity reference value Vref at Step 2A, the frequency of the sine wave to be swept is determined in accordance with a frequency range of the frequency characteristic to be measured at Step 3. Then, the sine wave having the set amplitude and the determined frequency is provided to the sweep signal Vadd at Step 4. That is, the feed axis will be excited with the sine wave having the amplitude less than the velocity reference value Vref, while moving the feed axis at a constant velocity. The Step 2A to Step 4 will be an exciting step.

Next, a frequency spectrum of an input and output signal of the transfer characteristic to be measured is calculated at Step 5. This means, for example, that when measuring the closed-loop transfer characteristic of the velocity control system, each of the frequency spectrum of the velocity command value Vc as the input signal and the frequency spectrum of the velocity detection value Vd as the output signal is calculated. The Step 5 will be a frequency spectrum calculating step in a measuring step.

As a method for calculating the frequency spectrum, FFT (fast Fourier transform) is well known. However, the method for calculating the frequency spectrum does not limited to this. For example, the frequency excited by the sweep signal Vadd is already-known, thus, a method that extracts only the spectrum of a single frequency by a method such as DFT (discrete Fourier transform) may be possible. Further, considering that operation is performed in real-time, it is also possible to use SDFT (sliding discrete Fourier transform).

Then, the transfer characteristic at the frequency of the swept sine wave is calculated, for example, based on the expression (1) and the expression (2) at Step 6. Within the frequency range of the transfer characteristic to be measured, the manipulation from Step 3 to Step 6 is repeated until the measurement of all the frequencies within the frequency range to be measured has completed, while varying the frequency of the sine wave to be excited, to ensure the measurement of the transfer characteristic. The procedure from Step 6 to the all frequencies measurement completion will be a frequency measuring step in the measuring step.

Thus, with the frequency characteristic measuring method according to the above-described embodiment 1, by executing the moving step (Step 1A) that commands the velocity reference value Vref such that the moving velocity of the feed axis is constant to move the feed axis in one direction, the exciting step (Step 2A to Step 4) that provides the sine wave having the amplitude less than the magnitude of the velocity reference value Vref to the sweep signal Vadd to excite, and the measuring step (from Step 5 to the all frequencies measurement completion) that measures the frequency characteristic of the feed axis drive system including the motor, the feed axis drive system is constantly continued to be moved in the one direction, even while exciting with the sine wave by the sweep signal Vadd. Accordingly, there is no worry that the grease and the lubricating oil are run out at the bearing and the guiding part t, which causes generation of the fretting. Additionally, the influence of the friction and the lost motion that reduce the controlled variable by, for example, inverting the moving direction can be eliminated to ensure the accurate frequency characteristic measurement.

Figure 4:
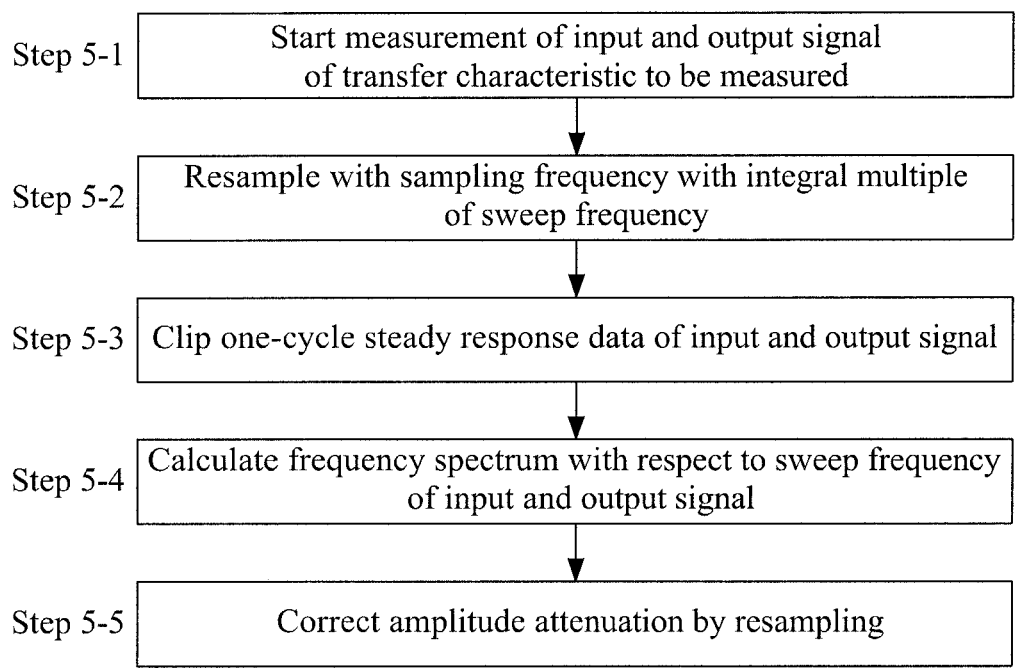
FIG. 4 is a flowchart illustrating a frequency characteristic measuring method according to an embodiment 2.

FIG. 4 is a flowchart illustrating a second embodiment in the frequency characteristic measuring method of the disclosure and having improved Step 5 (the frequency spectrum calculating step) in the first embodiment (FIG. 3). Other steps are identical to that in the embodiment 1. Thus, only the different procedure will be described.

After providing the sine wave to the sweep signal Vadd at Step 4, the measurement of the input and output signal of the transfer characteristic to be measured is started at next Step 5-1, and then, the resampling is performed with a sampling frequency with an integral multiple of the sweep frequency at Step 5-2. However, when preliminarily starting the measurement of the input and output signal with the sampling frequency with the integral multiple of the sweep frequency, this Step 5-2 is not necessary.

Next, at the point when repeatability is observed at each of the input and output signal, it is determined that transition from a transient state to a steady state has been performed to clip one-cycle steady response data of the input and output signal at Step 5-3. Here, the data of the input and output signal to be handled is data sampled at the sampling frequency with the integral multiple of the sweep frequency. Accordingly, consecutive time-series data are obtained by repeating the clipped one-cycle data. The data to be clipped here is not limited to the one-cycle data. The operation of the transfer characteristic is also possible by clipping the data with a plurality of cycles. However, clipping the data with the plurality of cycles only increases data amount and calculation amount, and contributes little to operation accuracy. Accordingly, the data to be clipped is preferred to be the one-cycle data.

Subsequently, the frequency spectrum with respect to the sweep frequency of the input and output signal is calculated at Step 5-4. As the method for calculating the frequency spectrum, similar to that at Step 5 in the first embodiment, any of the FFT (fast Fourier transform), the DFT (discrete Fourier transform), the SDFT (sliding discrete Fourier transform), and similar Fourier transform can be used. However, the FFT requires that the clipped one-cycle data is power-of-two. Thus, the DFT or the SDFT is available more generally. For saving the period required for the operation, the SDFT is preferred.

Then, the amplitude attenuation by resampling is corrected at Step 5-5. Usually, when resampling, data of an apex of waveform that has originally existed in the signal is missed by resampling to slightly decrease an amplitude of the waveform. For example, variances with respect to the one-cycle data before and after the resampling are compared to correct an amplitude spectrum based on this variation amount at Step 5-5.

Thus, with the frequency characteristic measuring method according to the above-described embodiment 2, in the frequency spectrum calculating step, the input and output signal is resampled with the sampling frequency with the integral multiple of the sweep frequency to clip at least one-cycle steady response data of the input and output signal, and the frequency spectrum with respect to the sweep frequency included in the clipped steady response data is calculated to correct the amplitude attenuation of the frequency characteristic due to the resampling. In the above manner, the period required for the sine wave excitation with each frequency component is limited to the sine-wave one-cycle period in the steady state and the period in the transient state until arriving at the steady state which is very short. Accordingly, the period required for measuring the frequency characteristic is minimized and the risk that the grease and the lubricating oil are run out at the bearing and the guiding part, which leads to the fretting, is suppressed.

Figure 5:
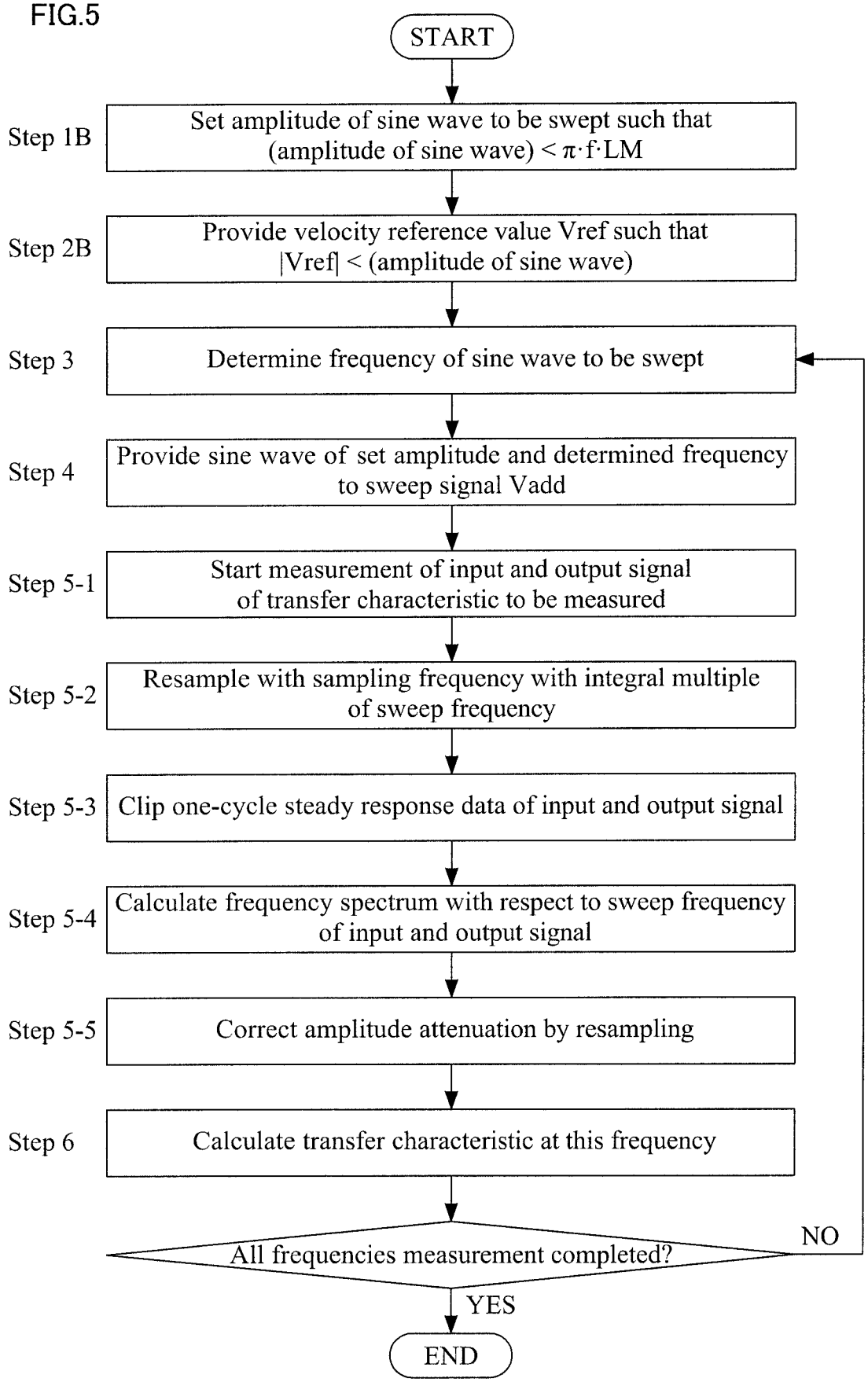
FIG. 5 is a flowchart illustrating a frequency characteristic measuring method according to an embodiment 3.

FIG. 5 is a flowchart illustrating a third embodiment in the frequency characteristic measuring method of the disclosure, where Step 1A and Step 2A in the first embodiment (FIG. 3) have been improved to Step 1B and Step 2B, and further, Step 5 has been changed to Step 5-1 to Step 5-5 in the second embodiment (FIG. 4).

First, the amplitude of the sine wave provided to the sweep signal Vadd is determined at Step 1B. Here, the amplitude of the sine wave is set to a value smaller than a product of a ratio of the circumference of a circle to its diameter $\pi$, a frequency f of the sine wave, and a lost motion amount LM of the feed axis drive system to be measured. This means that (amplitude of sine wave)/$2\pi f$ is less than LM/2, and (amplitude of sine wave)/$2\pi f$ corresponds to an amplitude of a displacement amount obtained by integrating the sine wave when providing the sine wave to the velocity signal. On the other hand, the lost motion amount LM is observable, for example, as a positioning error when positioning the feed axis from a positive direction and when positioning the feed axis from a negative direction. That is, the amplitude of the sine wave is specified such that the displacement when exciting with the sine wave falls within the range of the lost motion at Step 1B.

Next, at Step 2B, the velocity reference value Vref is provided such that the magnitude of the velocity reference value Vref is less than the amplitude of the sine wave determined at Step 1B. This, similar to Step 1A, corresponds to, for example, the provision of the F command by, for example, the NC program at the feed axis of the machine tool. The Step 2B will be the moving step. The subsequent procedure is similar to that in the first embodiment (FIG. 3) and the second embodiment (FIG. 4), thus omitting the explanation.

Thus, with the frequency characteristic measuring method according to the above-described embodiment 3, the amplitude of the sine wave is set to the value smaller than the product of the ratio of the circumference of a circle to its diameter $\pi$, the frequency f of the sine wave to be swept, and the lost motion amount LM of the feed axis drive system, and the magnitude of the velocity reference value Vref is set to be less than the set amplitude of the sine wave. Therefore, the frequency characteristic that focuses on the low-rigidity spring characteristic in the nonlinear spring characteristic that the lost motion indicates is measured.

The methods in the above-described respective embodiments do not limited to a case that separately performs each of them. It is also possible to measure the frequency characteristic with a combination of the methods in the embodiments 1 to 3. When such combination is performed, it is possible to measure the frequency characteristic focusing on the high-rigidity spring characteristic found out of the displacement range of the lost motion, thus both low-rigidity spring characteristic and high-rigidity spring characteristic of the nonlinear spring characteristic are evaluated in a frequency domain. Accordingly, a feedback-control controller considering a characteristic change (robustness) of the lost motion for a resonance characteristic and stability is optimized.

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

What is claimed is:

1. A method for measuring frequency characteristic of a feed axis drive system comprising a motor and a feed axis control unit configured to drive the motor in accordance with a velocity command value to control a velocity or a position of a movable portion of a driven body, the velocity command value including a velocity reference value from a host device or a velocity command calculator and a sweep signal swept in order to measure the frequency characteristic, the method comprising:
   moving a feed axis of the movable portion of the driven body in one direction by commanding the velocity reference value where a moving velocity of the feed axis is constant;
   determining a sine wave amplitude which is less than a magnitude of the velocity reference value,
   exciting by providing the determined sine wave to the sweep signal; and
   measuring the frequency characteristic of the feed axis drive system.

2. The method for measuring frequency characteristic of the feed axis drive system according to claim 1, wherein:
   the measuring includes:
      calculating a frequency spectrum of an input and output signal of a transfer characteristic to be measured; and
      calculating the transfer characteristic at a frequency within a predetermined frequency range, the calculation of the frequency spectrum includes resampling the input and output signal with a sampling frequency with an integral multiple of a frequency of the sweep signal to clip at least one-cycle steady response data of the input and output signal, and calculating the frequency spectrum with respect to the frequency of the sweep signal included in the clipped at least one-cycle steady response data to correct amplitude attenuation of the frequency characteristic due to the resampling.

3. A method for measuring frequency characteristic of a feed axis drive system comprising a motor and a feed axis control unit configured to drive the motor in accordance with a velocity command value to control a velocity or a position of a movable portion of a driven body, the velocity command value including a velocity reference value from a host device or a velocity command calculator and a sweep signal swept in order to measure the frequency characteristic, the method comprising:

moving a feed axis of the movable portion of the driven body in one direction by commanding the velocity reference value where a moving velocity of the feed axis is constant;

exciting by providing a sine wave having a predetermined amplitude to the sweep signal;

measuring the frequency characteristic of the feed axis drive system; and setting an amplitude of the sine wave to a value smaller than a product of a ratio of a circumference of a circle to its diameter, a frequency of the sine wave to be swept, and a lost motion amount of the feed axis drive system, and setting a magnitude of the velocity reference value to be less than the amplitude of the sine wave, wherein:

the measuring includes:

calculating a frequency spectrum of an input and output signal of a transfer characteristic to be measured; and calculating the transfer characteristic at a frequency within a predetermined frequency range, the calculation of the frequency spectrum includes resampling the input and output signal with a sampling frequency with an integral multiple of a frequency of the sweep signal to clip at least one-cycle steady response data of the input and output signal, and calculating the frequency spectrum with respect to the frequency of the sweep signal included in the clipped at least one-cycle steady response data to correct amplitude attenuation of the frequency characteristic due to the resampling.

\* \* \* \* \*